United States Patent
LaPree et al.

(10) Patent No.: US 10,244,662 B2
(45) Date of Patent: Mar. 26, 2019

(54) METHOD AND APPARATUS FOR ACOUSTICAL NOISE REDUCTION AND DISTRIBUTED AIRFLOW

(71) Applicant: International Business Machines Corporation, Armonk, NY (US)

(72) Inventors: Scott R. LaPree, Rochester, MN (US); Howard V. Mahaney, Jr., Cedar Park, TX (US); Stephen P. Mroz, Rochester, MN (US); Michael D. O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 14/966,579

(22) Filed: Dec. 11, 2015

(65) Prior Publication Data

US 2017/0172014 A1 Jun. 15, 2017

(51) Int. Cl.
*H05K 7/20* (2006.01)
*F24F 13/24* (2006.01)

(52) U.S. Cl.
CPC ..... *H05K 7/20736* (2013.01); *H05K 7/20181* (2013.01); *F24F 2013/242* (2013.01)

(58) Field of Classification Search
CPC ................. H05K 7/20736; F24F 13/24; F24F 2013/242; Y10S 454/906
See application file for complete search history.

(56) References Cited

U.S. PATENT DOCUMENTS

| | | | | |
|---|---|---|---|---|
| 1,783,276 A | * | 12/1930 | Bliss | E06B 7/10 181/292 |
| 1,816,769 A | * | 7/1931 | Fisk | E06B 7/08 181/224 |
| 1,865,677 A | * | 7/1932 | Cheyney | F24F 13/24 138/38 |
| 2,704,504 A | * | 3/1955 | Wilkening | E06B 7/02 181/224 |
| 3,789,747 A | | 2/1974 | Farrar et al. | |
| 4,316,522 A | * | 2/1982 | Hirschorn | F04D 29/664 181/224 |
| 4,335,797 A | * | 6/1982 | Simmons | B60R 13/0838 165/135 |
| 4,660,676 A | | 4/1987 | Eustace | |
| 5,723,831 A | * | 3/1998 | Martin | E04B 2/7422 181/287 |

(Continued)

FOREIGN PATENT DOCUMENTS

| | | |
|---|---|---|
| CN | 104514475 A | 4/2015 |
| EP | 2554034 B1 | 2/2014 |

*Primary Examiner* — Justin B Rephann
(74) *Attorney, Agent, or Firm* — Patterson + Sheridan, LLP

(57) ABSTRACT

A server rack door has a first dimension and a second dimension orthogonal to the first dimension and includes a first group of first obstructions arranged along the first dimension. The first obstructions define a first plurality of flow channels. The server rack door further includes a second group including second obstructions arranged along the first dimension and offset from the first obstructions along the second dimension. The second dimension corresponds to a thickness of the server rack door. The second obstructions define a second plurality of flow channels, where the first obstructions and the second obstructions alternate along the first dimension.

20 Claims, 6 Drawing Sheets

(56) References Cited

U.S. PATENT DOCUMENTS

| | | | |
|---|---|---|---|
| 6,198,627 B1 | 3/2001 | Roehling et al. | |
| 6,481,527 B1 | 11/2002 | French et al. | |
| 6,589,112 B2 * | 7/2003 | Ruach | F24F 13/02 181/224 |
| 7,283,359 B2 | 10/2007 | Bartell et al. | |
| 7,334,662 B1 | 2/2008 | Anderl et al. | |
| 7,646,603 B2 | 1/2010 | Bard et al. | |
| 7,727,059 B2 | 6/2010 | Merino | |
| 8,485,310 B2 * | 7/2013 | Tanabe | G10K 11/172 181/224 |
| 8,511,426 B2 | 8/2013 | Colam | F16L 9/21 181/224 |
| 2002/0115406 A1 * | 8/2002 | Ruach | F24F 13/02 454/254 |
| 2004/0007347 A1 * | 1/2004 | Stoller | H05K 7/206 165/47 |
| 2004/0100770 A1 * | 5/2004 | Chu | H05K 7/20754 361/698 |
| 2007/0230114 A1 * | 10/2007 | Bartell | H05K 7/20736 361/679.47 |
| 2008/0106864 A1 * | 5/2008 | Merino | G06F 1/181 361/688 |
| 2008/0230305 A1 * | 9/2008 | Goto | G06F 1/182 181/224 |
| 2008/0257639 A1 * | 10/2008 | Yamaguchi | H05K 7/20736 181/198 |
| 2008/0259563 A1 * | 10/2008 | Fukuda | G06F 1/182 361/695 |
| 2009/0097205 A1 * | 4/2009 | Matsushima | H05K 7/20736 361/700 |
| 2009/0303678 A1 * | 12/2009 | Ishimine | G06F 1/20 361/679.48 |
| 2011/0067948 A1 * | 3/2011 | Bard | A47B 97/00 181/198 |
| 2011/0175504 A1 * | 7/2011 | Cook | H05K 7/20572 312/236 |
| 2011/0214935 A1 * | 9/2011 | Cursetjee | F24F 3/1603 181/224 |
| 2015/0267404 A1 * | 9/2015 | Yau | E04C 2/523 52/794.1 |

* cited by examiner

METHOD AND APPARATUS FOR ACOUSTICAL NOISE REDUCTION AND DISTRIBUTED AIRFLOW

I. FIELD OF THE DISCLOSURE

The present disclosure relates to method and apparatus for acoustical noise reduction and distributed airflow.

II. BACKGROUND

Electronic equipment housed in a server rack system may generate a large amount of heat. As such, significant airflow may be used to keep the electronic equipment within acceptable thermal limits, such as limits associated with functionality and reliability of servers within the server rack system. To provide airflow, cooling subsystems using fans or blowers have deployed. As heat dissipation requirements of server rack systems increase, more fans may be used or the operating speed of fans may be increased. Increasing the number or operating speed of fans causes an increase in the acoustical noise generated by the fans.

Some server rack systems use acoustical doors to attenuate noise generated by the fans, but acoustical doors have certain drawbacks which may limit their utility. For example, some acoustical doors are quite thick. Accordingly, adding such acoustical doors to a server rack can significantly increase a footprint of the server rack. Data centers tend to have limited floor space. Using server racks with a larger footprint results in narrower aisles between the server racks or fewer rows of server racks within the data center. In addition, shipping such acoustical doors may be more cumbersome and expensive due to their large size. For example, when the acoustical doors are installed on the server rack before shipping, a larger pallet may be used.

Another drawback of the acoustical doors is that they tend to increase airflow impedance. To overcome the added airflow impedance, the fans may be operated at higher speeds. Increasing the fan speed also increases the acoustical noise emission level.

III. SUMMARY OF THE DISCLOSURE

In a first aspect of the disclosure, a server rack is disclosed. In one embodiment, the server rack includes a server rack door having a first dimension and a second dimension orthogonal to the first dimension. The server rack door includes a first group of first obstructions arranged along the first dimension. The first obstructions define a first plurality of flow channels. The server rack door also includes a second group of second obstructions arranged along the first dimension and offset from the first obstructions along the second dimension. The second dimension corresponds to a thickness of the server rack door. The second obstructions define a second plurality of flow channels such that the first obstructions and the second obstructions alternate along the first dimension.

In a second aspect of the disclosure, a server rack door is disclosed. In one embodiment, the server rack door has a first dimension and a second dimension orthogonal to the first dimension and includes a first group of first obstructions arranged along the first dimension of the server rack door. The first obstructions define a first plurality of flow channels. The server rack door also includes a second group including second obstructions arranged along the first dimension and offset from the first obstructions along the second dimension. The second dimension corresponds to a thickness. The second obstructions define a second plurality of flow channels such that the first obstructions and the second obstructions alternate along the first dimension.

In a third aspect of the disclosure, a method is disclosed. In one embodiment, the method includes at a server rack having a server rack door comprising a first group of first obstructions arranged along a first dimension, the first obstructions defining a first plurality of flow channels; and a second group of second obstructions arranged along the first dimension and offset from the first obstructions, wherein the second obstructions define a second plurality of flow channels, and wherein the first obstructions and the second obstructions alternate along the first dimension, performing receiving an airflow at a first plurality of flow channels. The method also includes routing at least a portion of the airflow from the first plurality of flow channels to a second plurality of flow channels.

One advantage of the server rack door of the present disclosure is that the server rack door divides airflow into a large number of parallel paths that are distributed across the first dimension of the server rack door. Thus, each path carries a small percentage of the total airflow. Airflow in each path is redirected over a relatively small distance, such as less than 2 inches, creating a relatively uniform flow field entering the server rack. Additionally, since obstructions are arranged in offset or staggered rows, there may be no direct line-of-sight path for noise to exit the server rack door, and each of the plurality of obstructions has a streamlined shape, which permits the airflow to flow smoothly as the airflow passes through the doors. Additionally, by using many relatively small airflow paths, large airflow channels that increase the thickness of conventional server rack acoustical doors are avoided. As a result, the disclosed server rack door can be much thinner than convention server rack acoustical doors with large airflow channels.

IV. BRIEF DESCRIPTION OF THE DRAWINGS

V. DETAILED DESCRIPTION

Figure 1:
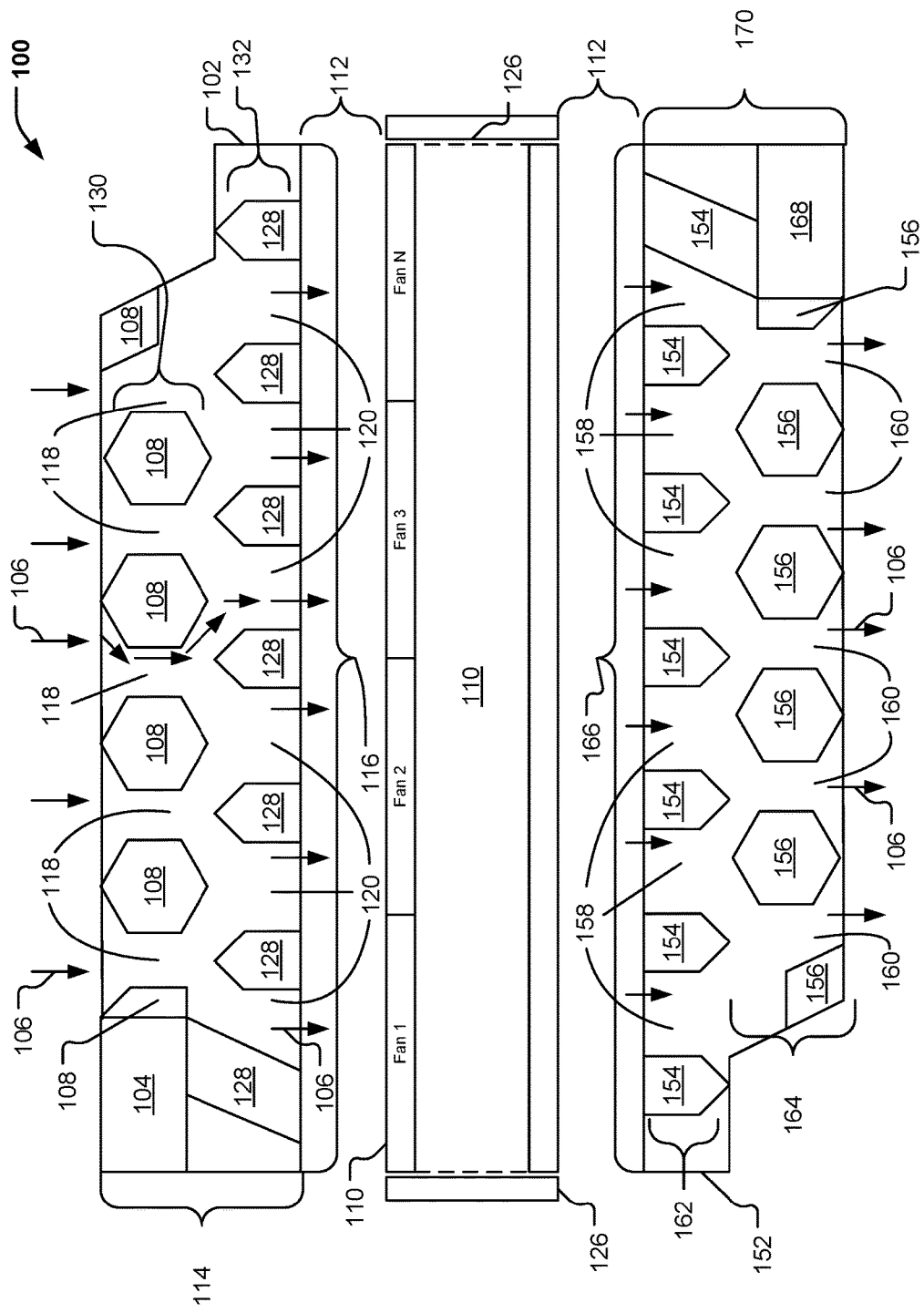
FIG. 1 is a top cross-sectional view of one embodiment of a server rack system with internal features configured to distribute airflow among a plurality of flow channels.

FIG. 1 is a top cross-sectional view of one embodiment of a server rack system 100 with internal features configured to distribute airflow 106 among a plurality of flow channels 118, 120, 158, 160. In the illustrated embodiment, the server rack system 100 includes a first door 102, a second door 152, a plurality of information technology devices 110 (e.g., servers), and a plurality of support members 126.

The first door 102 has a first dimension 116 and a second dimension 114 orthogonal to the first dimension 116. The first dimension 116 corresponds to a width of the door 102 and the second dimension 114 corresponds to a thickness of the door 102. The second door 152 has a third dimension 166 and a fourth dimension 170 orthogonal to the third dimension 166. The third dimension 166 corresponds to a width of the door 152 and the fourth dimension 170 corresponds to a thickness of the door 152. For example, in one embodiment, the thickness is about 106 mm, which is roughly forty four percent (44%) thinner than some conventional acoustical doors. The thinner door provides significant advantages. For example, the doors 102, 152 take up less room on a data center floor. In addition, when shipping the doors 102, 152 with the server rack system 100, a smaller pallet may be used, and when the doors are shipped individually, the doors 102, 152 take up less shipping space.

The first door 102 may include or may be coupled to a latch 104, a hinge (not shown), other features, of a combination there. Additionally, the first door 102 includes a plurality of obstructions 108, 128. In one embodiment, the plurality of obstructions 108 are arranged along the first dimension 116 (e.g., the width) of the first door 102 forming a first group 130 of the plurality of obstructions 108. The first group 130 of the plurality of obstructions 108 may correspond to a first row of the plurality of obstructions 108. The first group 130 of the plurality of obstructions defines a first plurality of flow channels 118. For example, the first group 130 of the plurality of obstructions 108 defines the first plurality of flow channel 118, which distributes airflow 106 across the first dimension 116 of the first door 102.

In another embodiment, the first door 102 includes a second group 132. Each of the plurality of obstructions 128 of the second group 132 is arranged along the first dimension 116 (e.g., the width) of the first door 102 and is offset from the first group 130 of the plurality of obstructions 108 along the second dimension 114 (e.g., the thickness) of the first door 102. The second group 132 of the plurality of obstructions 128 may correspond to a second row of the plurality of obstructions 128. The second group 132 of the plurality of obstructions 128 defines a second plurality of flow channels 120. The second plurality of flow channels 120 are configured to receive the airflow 106 from the first plurality of flow channels 118 and to distribute the airflow 106 into the plenum region 112 of the server rack system 100. The plurality of obstructions 108 of the first group 130 alternates with the plurality of obstructions 128 of the second group 132, which allows for a small displacement of the airflow 106 between the plurality of flow channels 118 and 120. The small displacement of the airflow 106 between the plurality of flow channels 118 and 120 permits the airflow 106 to become substantially uniform a short distance after passing through the first door 102. In one embodiment, the substantially uniform airflow through the plurality of flow channels 118, 120 allows for the plenum region 112 to be small (e.g., a short distance between the first door 102 and the information technology devices 110). A width of the individual flow paths of the plurality of flow channels 118, 120 may be 21 mm, which is small enough that a person is not able to reach through a locked door of the server rack system 100 to access the information technology devices 110. In addition, the plurality of flow channels 118, 120 provide for substantially uniform distribution of airflow to inhibit formation of hotpots in regions with reduced airflow. For example, conventional acoustical doors that provide only two airflow paths may form hot spots within the server rack system as a result of uneven airflow distributions across the width of the acoustical door, which may cause damage to the servers within the server rack system.

The second door 152 may include or may be coupled to a latch 168, a hinge (not shown), other features, of a combination there. Additionally, the second door 152 includes a plurality of obstructions 154, 156. In one embodiment, the plurality of obstructions 154 are arranged along the third dimension 166 (e.g., the width) of the second door 152 forming a third group 162 of the plurality of obstructions 154. The third group 162 of the plurality of obstructions 154 may correspond to a row of the plurality of obstructions 154. The third group 162 of the plurality of obstructions 154 defines a third plurality of flow channels 158. For example, the third group 162 of the plurality of obstructions 154 defines the third plurality of flow channels 158 which receives the airflow 106 across the third dimension 166 of the second door 152. The third plurality of flow channels 158 is configured to receive the airflow 106 from the plenum region 112 of the server rack system 100 and to distribute the airflow 106 across the third dimension of the second door 102 and to discharge the airflow 106 out of the server rack system 100 through the second door 152.

In another embodiment, the second door 152 includes a fourth group 164 including the plurality of obstructions 156. Each of the plurality of obstructions 156 of the fourth group 164 is arranged along the third dimension 166 (e.g., the width) of the second door 152 and is offset from the third row 162 of the plurality of obstructions 154 along the fourth dimension 170 (e.g., the thickness) of the second door 152. The fourth group 164 of the plurality of obstructions 156 may correspond to a fourth row of the plurality of obstructions 156. The fourth group 164 of the plurality of obstructions 156 defines a fourth plurality of flow channels 160. The fourth plurality of flow channels 160 are configured to receive the airflow 106 from the third plurality of flow channels 158 and to discharge the airflow 106 through the second door 152 and outside of the server rack system 100. The plurality of obstructions 154 of the third group 162 alternates with the plurality of obstructions 156 of the fourth group 164, which allows for a small displacement of the airflow 106 between the plurality of flow channels 158 and 160. The small displacement of the airflow 106 between the plurality of flow channels 158 and 160, permits the airflow 106 to flow substantially uniform through the second door 152. In one embodiment, the substantially uniform airflow through the plurality of flow channels 158, 160 allows for the plenum region 112 to be small (e.g., a short distance between the second door 152 and the information technology devices 110). For example, a width of the individual flow paths of the plurality of flow channels 158, 160 may be 21 mm, which is small enough that a person is not able to reach through a locked door of the server rack system 100 to access the information technology devices 110.

Although the embodiment illustrated in FIG. 1 includes two groups 130, 132 for the first door 102 and two groups 162, 164 for the second door 152 of obstructions in other embodiments, the doors 102, 152 may include more than two groups of obstructions, such as three, four, or more groups of obstructions 108, 128, 154, 156. Each of the plurality of obstructions 108, 128, 154, 156 of the additional groups may be arranged along the first dimension 116 or the third dimension 166 of the doors 102, 152 and offset from the previous group of the plurality of obstructions 108, 128, 154, 156 along the second dimension 114 or the fourth dimension 170 of the doors 102, 152. The additional groups of the plurality of obstructions 108, 128, 154, 156, may define additional flow channels. The additional flow channels are configured to receive the airflow 106 from the previous flow channel and either distributes the airflow along another group of the plurality of obstructions or into the plenum region 112 of the server rack system 100 or discharge the airflow 106 from the server rack system 100.

The plurality of support members 126 are configured to store and hold the information technology devices 110. In one embodiment, the information technology devices 110 include a plurality of fans and a plurality of servers. The plurality of servers are stored in the server rack system 100 by the plurality of support members 126 which define a plurality of server bays. The plurality of fans are held in the server rack system 100 by at least one of the plurality of support members 126 being configured to have the plurality of fans coupled to at least one of the plurality of support members 126.

Figure 2A:
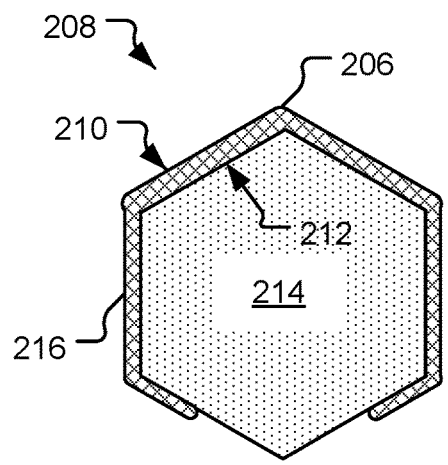
FIG. 2A is a top cross-sectional view of one embodiment of an obstruction within a server rack door.
Figure 2B:
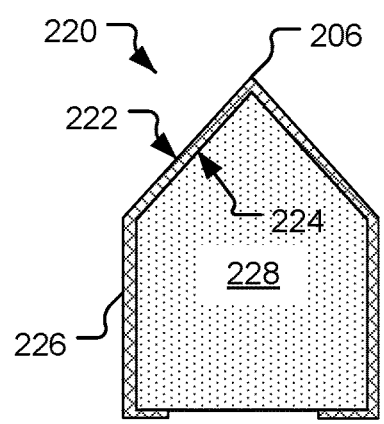
FIG. 2B is a top cross-sectional view of another embodiment of an obstruction within a server rack door.

FIGS. 2A and 2B are a top cross-sectional view of one embodiment of obstructions 208 and 220. The obstruction 208 may correspond to the plurality of obstructions 108 or 156 within the doors 102 and 152, as in FIG. 1. The obstruction 220 may correspond to the plurality of obstructions 128 or 154 within the doors 102 and 152, as in FIG. 1. In another embodiment, the groups 130, 132, 162, or 164 may use obstructions 208 and/or 220. The obstructions 208 and 220 provide a multitude of surfaces to absorb acoustic energy and to block line-of-sight to the noise generating information technology devices 110.

The obstruction 208 includes a structural member 216. The structural member 216 includes a first side 210 (e.g., outside) and a second side 212 (e.g., inside). The second side 212 faces inwards towards the information technology devices 110 and the first side 210 faces outwards away from the information technology devices 110. The structural member 216 reflects noise generated by the information technology devices 110 back towards the information technology devices 110. The structural member 216 may be of a metal or polymer material.

The obstruction 208 may also include an acoustic absorbing material 214. The acoustic absorbing material 214 may be formed of or include a foam material. The acoustic absorbing material absorbs acoustic energy from inside the second side 212 and absorbs more acoustic energy when sound waves are reflected from the second side 212 back towards the information technology devices 110. Thus, the structural member 216 acts to redirect the sound waves (e.g., noise generated by the information technology devices 110), and the acoustic absorbing material 214 acts to mitigate the sound waves.

The obstruction 220 includes a structural member 226. The structural member 226 includes a first side 222 (e.g., outside) and a second side 224 (e.g., inside). The second side 224 faces inwards towards the information technology devices 110, and the first side 222 faces outwards away from the information technology devices 110. The structural member 226 reflects noise generated by the information technology devices 110 back towards the information technology devices 110. The structural member 226 may be formed of or include a metal or polymer material.

The obstruction 220 may also include an acoustic absorbing material 228. The acoustic absorbing material 228 may be formed of or include a foam material. The acoustic absorbing material 214 absorbs acoustic energy propagating from inside the server rack system 100 (e.g., from the information technology devices 110) and absorbs more acoustic energy when the sound waves are reflected from the second side 224 back towards the information technology devices 110. Thus, the structural member 226 acts to redirect the sound waves, and the acoustic absorbing material 228 acts to mitigate the sound waves.

In one embodiment, the acoustic absorbing material 214 and/or 228 is at least one inch thick. In other embodiments, the acoustic absorbing material 214 and/or 228 may be less than one inch thick or greater than one inch thick, so that a wider variety of sound frequencies generated by the information technology devices 110 are absorbed. The structural members 216, 226, in one embodiment, provide support for the acoustic absorbing material 214, 228 and reflects noise generated by the information technology devices 110 back towards the information technology devices 110.

The obstructions 208, 220 may include a plurality of vertexes 206. Each of the plurality of vertexes 206 may be tapered to permit the airflow 106 to flow smoothly around the obstructions 208 and 220. The vertexes 206 being tapered provide for a lower airflow impedance. The lower airflow impedance reduces the speed of the fans, which in turn, decreases the sound waves produced from the information technology devices 110. In addition, at least one of the plurality of vertexes 206 is arranged to face outwards from the information technology devices 110, as in FIG. 1. In one embodiment, the obstructions 208, 220 may have a polygon shaped cross-section, such as a pentagon or a hexagon along a plane parallel to the width 116, 166 of the doors 102, 152, as in FIG. 1. In another embodiment, any polygon shape may be used for the obstructions 208, 220. In addition, the obstructions 208, 220 having the general shape and features, as described above, and including the arrangement of the plurality of obstructions 108, 128, 154, 156, as in FIG. 1, provide significant acoustical attenuation.

Figure 3:
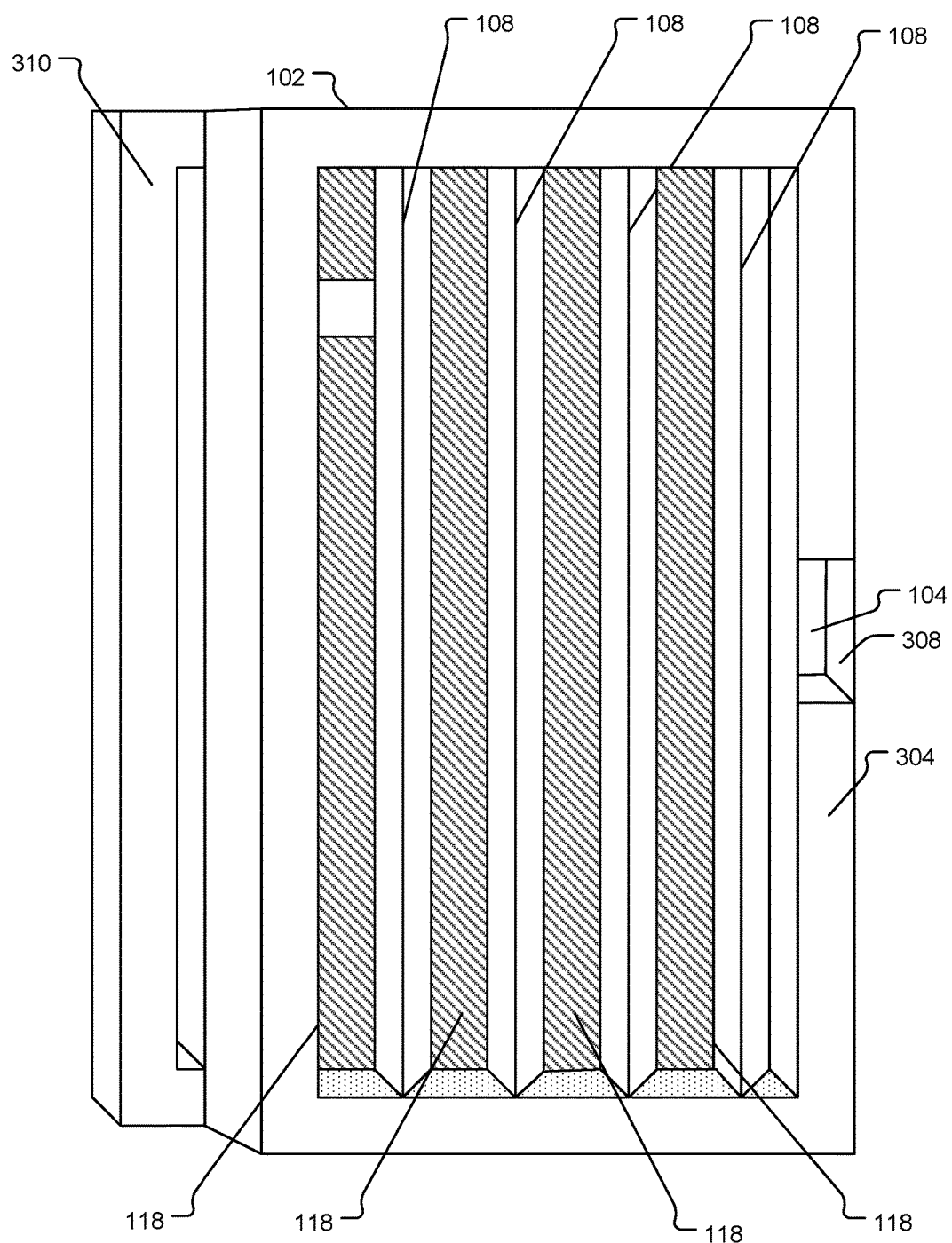
FIG. 3 is a front perspective view of one embodiment of a server rack door.

FIG. 3 is a front perspective view of one embodiment of the first door 102. In the illustrated embodiment, the first door 10 includes frames 304, 310, the first group 130 of the plurality of obstructions 108, the first plurality of flow channels 118, a hinge (not shown), and the latch 104. The second group 132 of the plurality of obstructions 128 is omitted from FIG. 3 for clarity of illustration. It should be noted that, as described above, the plurality of obstructions 108 of the first group 130 alternates with the plurality of obstructions 128 of the second group 132. Accordingly, the second group 132 of the plurality of obstructions 128 would be visible in the first plurality of flow channels 118 region if not omitted, but would make the representation of the first plurality of flow channels unclear.

The plurality of obstructions 108 defines the first plurality of flow channels 118. The latch 104 is provided at a recess 308 in the frame 304. On an opposite side of the frame 304 of the latch 104 is the hinge. The hinge in one embodiment, comprises a pivot structure that includes a pair of depending pins that are adapted to be received in cooperating apertures of plates mounted on at least one of the plurality of supporting members 126. In another embodiment, the hinge comprises conventional hinges for connecting the first door 102 to at least one of the plurality of supporting members 126. The frame 310 is recessed from the frame 304. The recess permits the first door 102 to open without hitting the plurality of support members 126 or an adjacent server rack system 100.

In another embodiment, the second door 152 is similar to the embodiment of FIG. 3 of the first door 102. For example, the second door 152 may include such similar features as the frames 304, 310, and the hinge. In addition, the second door 152 includes the third group 162 of the plurality of obstructions 154, the fourth group 164 of the plurality of obstructions 156, the plurality of flow channels 158, 160 and the latch 168. The plurality of obstructions 156 defines the plurality of flow channels 160. The latch 168 is provided at the recess 308 in the frame 304. On an opposite side of the frame 304 of the latch 168 is the hinge. The hinge includes similar features, as described above, with reference to the first door 102. The frame 310 is recessed from the frame 304. The recess permits the second door 152 to open without hitting the plurality of support members 126 or an adjacent server rack system 100.

Figure 4:
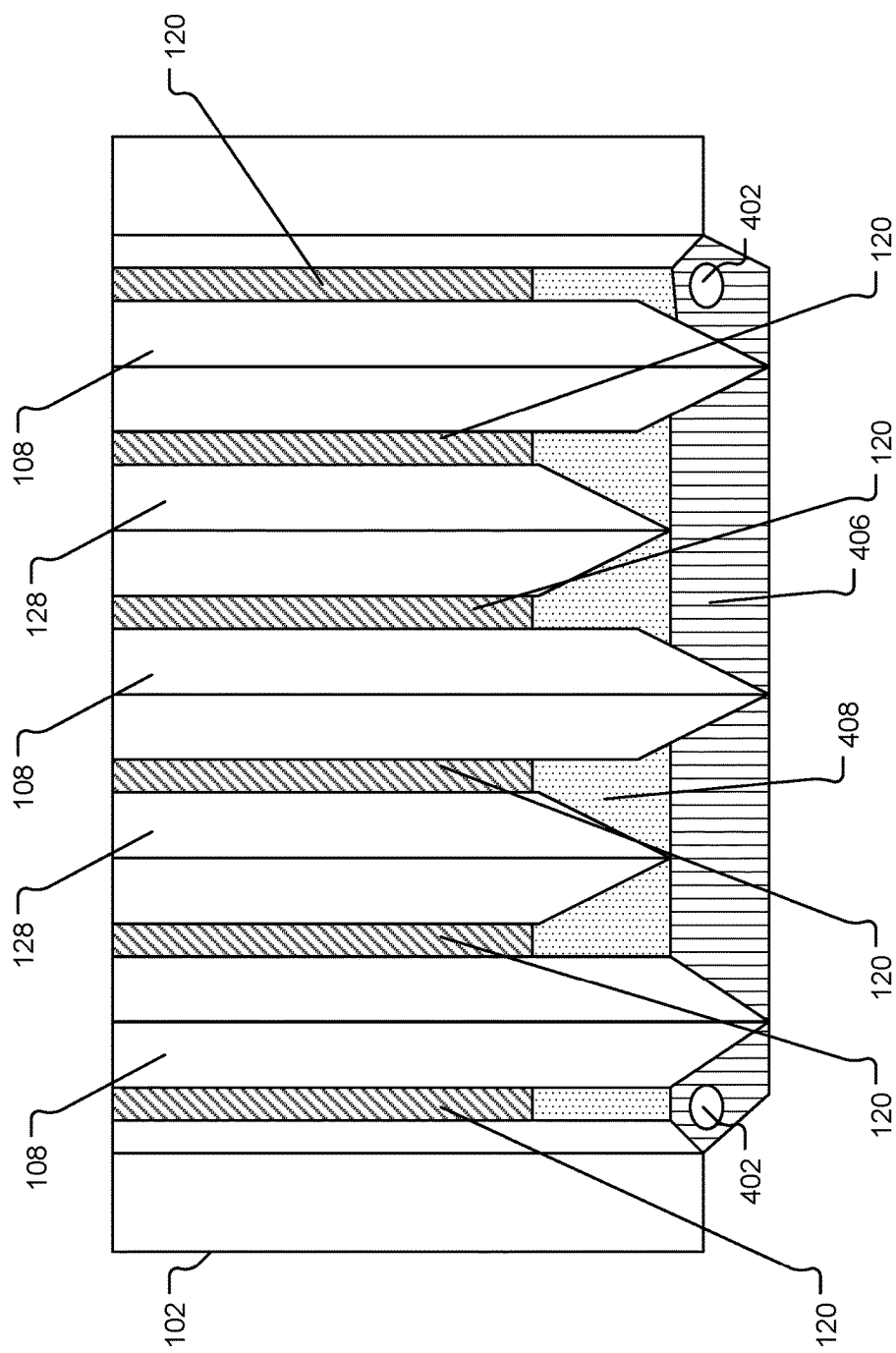
FIG. 4 is a partial front perspective view of another embodiment of a server rack door.

FIG. 4 is a partial front perspective view of another embodiment of the first door 102. In the illustrated embodiment, the first door 102 includes a first group of the plurality of obstructions 108, a second group of the plurality of obstructions 128, wall portions 406, 408 and an adjustment device 402. The plurality of obstructions 108 of the first group are arranged along a first dimension (e.g., a width) of the first door 102 forming the first group of the plurality of obstructions 108 along the wall portion 406. The first group 130 of the plurality of obstructions 108 defines the first plurality of flow channels 118, as in FIG. 1. In addition, arranging the plurality of obstructions 108 along the first dimension 116 of the first door 102 permits the airflow 106 to be distributed among the first plurality of flow channels 118, as in FIG. 1. The second group of the plurality of obstructions 128 may be formed along the wall portion 408 by having the plurality of obstructions 128 arranged along the first dimension (e.g., the first dimension) of the first door 102 and spaced apart from the first group of the plurality of obstructions 108 along a second dimension orthogonal to the first dimension (e.g., a thickness) of the first door 102. The adjustment device 402 may be located on the wall portion 406 and may be configured to enable the wall portion 406 to slide toward or away from the wall portion 408 so that a depth between the first group of the plurality of obstructions 108 and the second group of the plurality of obstructions 128 is adjustable.

In another embodiment, the second door 152 is similar to the embodiment of FIG. 4 of the first door 102. For example, the second door 152 may include such similar features as the wall portions 406, 408 and the adjustment device 402. In addition, the second door 152 includes the third group 162 of the plurality of obstructions 154, the fourth group 164 of the plurality of obstructions 156, as in FIG. 1. The fourth group of the plurality of obstructions 156 may be formed along the wall portion 406 by arranging the plurality of obstructions 156 along the third dimension (e.g., a width) of the second door 152. The fourth group of the plurality of obstructions 156 defines the plurality of flow channels 160. The third group of the plurality of obstructions 154 may be formed along the wall portion 408 by arranging the plurality of obstructions 154 along the third dimension of the second door 152 and offset from the fourth group of the plurality of obstructions 156 along the a fourth dimension orthogonal to the third dimension (e.g., a thickness) of the second door 152. The adjustment device 402 may be located on the wall portion 406 and configured to permit the wall portion 406 to slide toward or away from the wall portion 408 to permit for various depths between the fourth group of the plurality of obstructions 156 and the third group of the plurality of obstructions 154.

In another embodiment, the doors 102, 152 may include additional groups of the plurality of obstructions 108, 128, 154, 156 (e.g., three, four, or more groups of the plurality of obstructions 108). Each of the plurality of obstructions of the additional groups may be arranged along the first dimension and the third dimension (e.g., the width) of the doors 102, 152 and offset from the previous group of the plurality of obstructions along the second dimension orthogonal to the first dimension and the fourth dimension orthogonal to the third dimension (e.g., the thickness) of the doors 102, 152.

The additional groups of the plurality of obstructions may define additional plurality of flow channels. The adjustment device 402 may be located on each of the addition wall portions and configured to permit each of the wall portions to slide toward or away from the adjacent wall portions to permit for various depths between the groups of the plurality of obstructions.

Figure 5:
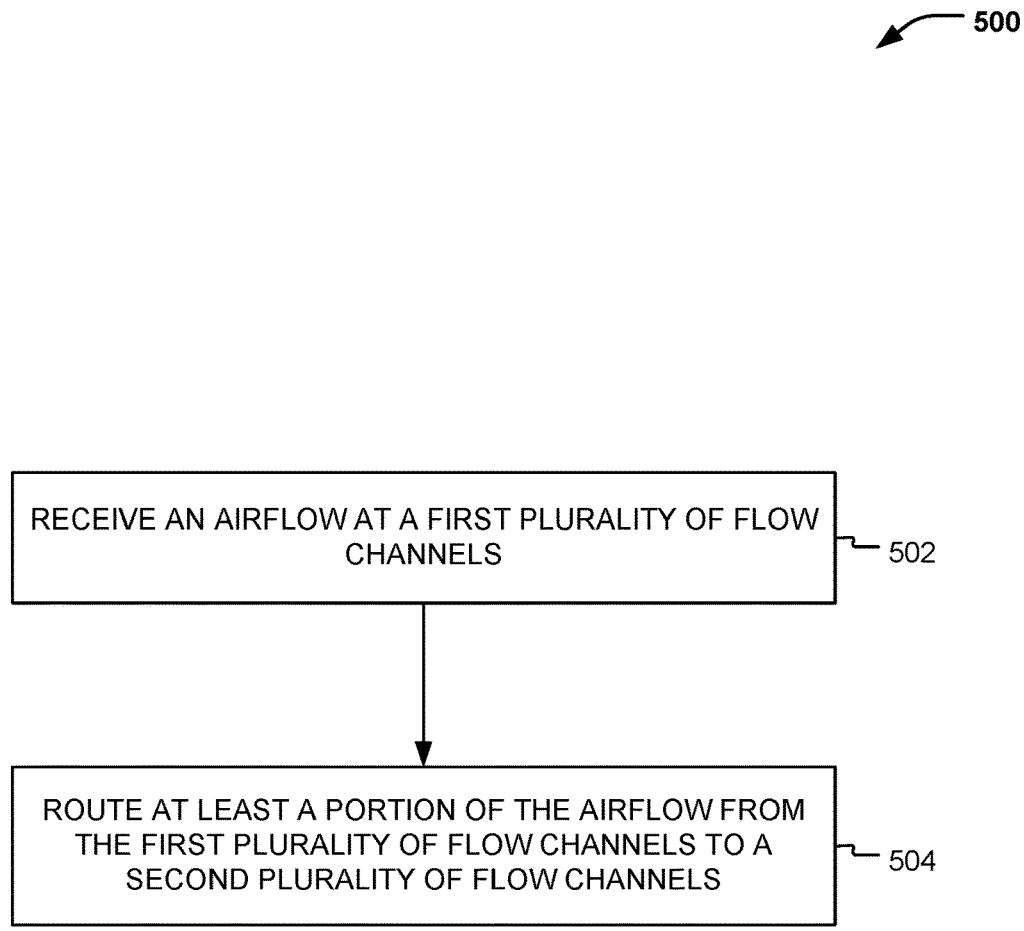
FIG. 5 is a flow chart illustrating one embodiment of a method of receiving and routing airflow among a plurality of obstructions.

FIG. 5 is a flow chart illustrating one embodiment of a method 500 of receiving and routing an airflow among a plurality of obstructions. In a particular embodiment, the method 500 may be performed by a server rack door, such as the first door 102 of FIG. 1 or by the server rack system 100 of FIG. 1 including the doors 102 and 152. The first door 102 may include the first group 130 of the plurality of obstructions 108 arranged along the first dimension 116 (e.g., a width) of the first door 102 to form the first plurality of flow channels 118. Further, the first door 102 may include the second group 132 of the plurality of obstructions 128 arranged along the first dimension 116 (e.g., the width) of the first door 102 and offset from the first group 130 of the plurality of obstructions 108 along the second dimension 114 orthogonal to the first dimension 116 (e.g., a thickness) of the first door 102. The second group 132 of the plurality of obstructions 108 defines the second plurality of flow channels 120.

The method includes, at 502, receiving an airflow at a first plurality of flow channels. For example, as described with reference to FIG. 1, the first door 102 may include the first group 130 of the plurality of obstructions 108 arranged along the first dimension 116 (e.g., a width) of the first door 102 to form the first plurality of flow channels 118. Thus, the flow of the airflow may be diverted by the first group 130 of the plurality of obstructions 108 and received by the first plurality of flow channels 118 of the first door 102.

The method further includes, at 504, routing at least a portion of the airflow from the first plurality of flow channels to a second plurality of flow channels. For example, as described with reference to FIG. 1, the first door 102 may include the second group 132 of the plurality of obstructions 128 arranged along the first dimension 116 (e.g., the width) of the first door 102 and offset from the first group 130 of the plurality of obstructions 108 along the second dimension 114 orthogonal to the first dimension 116 (e.g., a thickness) of the first door 102. The second group 132 of the plurality of obstructions 108 defines the second plurality of flow channels 120. Thus, the flow of the airflow may be diverted by the second group 132 of the plurality of obstructions 128 and received by the second plurality of flow channels 120 of the first door 102.

The method 500 may further include routing the portion of the airflow from the second plurality of flow channels into a plenum region of the server rack system. The method 500 may further include, receiving the portion of the airflow from the plenum region of the server rack system and routing the received portion of the airflow to the plurality of fans. The method 500 may also include, routing the portion of the airflow from the plurality of fans over the plurality of servers within the server rack system. For example, as described with reference to FIG. 1, the first door 102 may include the second plurality of flow channels 120 that are configured to receive the airflow from the first plurality of flow channels 118 and to distribute the airflow into the plenum region 112 of the server rack system 100. The information technology devices 110, with reference to FIG. 1, includes a plurality of fans and a plurality of servers. The plurality of fans are configured to receive the airflow and to distribute the airflow over the plurality of servers within the servers rack system 100.

Figure 6:
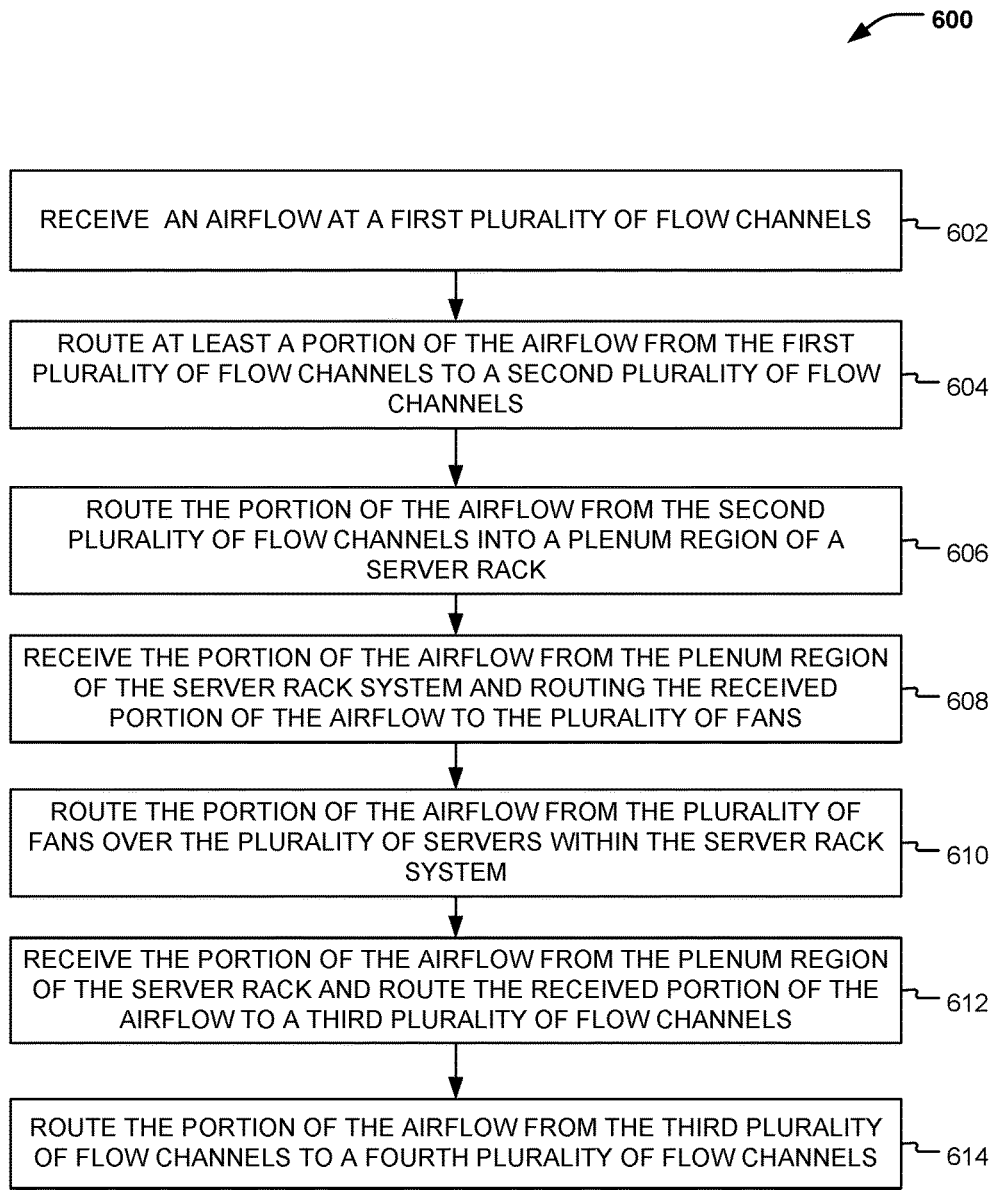
FIG. 6 is a flow chart illustrating another embodiment of a method of receiving and routing airflow among a plurality of obstructions.

FIG. 6 is a flow chart illustrating another embodiment of a method 600 of receiving and routing an airflow among a plurality of obstructions. In a particular embodiment, the method 600 may be performed by a server rack door, such as the first door 102 of FIG. 1 or by the server rack system 100 of FIG. 1 including the doors 102 and 152. The first door 102 may include the first group 130 of the plurality of obstructions 108 arranged along the first dimension 116 (e.g., a width) of the first door 102 to form the first plurality of flow channels 118. Further, the first door 102 may include the second group 132 of the plurality of obstructions 128 arranged along the first dimension 116 (e.g., the width) of the first door 102 and offset from the first group 130 of the plurality of obstructions 108 along the second dimension 114 orthogonal to the first dimension 116 (e.g., a thickness) of the first door 102. The second group 132 of the plurality of obstructions 108 defines the second plurality of flow channels 120. The second door 152 may include the third group 162 of the plurality of obstructions 154 arranged along the third dimension 166 (e.g., a width) of the second door 152 to form the third plurality of flow channels 158. Further, the second door 152 may include the fourth group 164 of the plurality of obstructions 156 arranged along the third dimension 166 (e.g., the width) of the second door 152 and offset from the third group 162 of the plurality of obstructions 154 along the fourth dimension 170 orthogonal to the third dimension 116 (e.g., a thickness) of the second door 152. The fourth group 164 of the plurality of obstructions 156 defines the fourth plurality of flow channels 160.

The method includes, at 602, receiving an airflow at a first plurality of flow channels. For example, as described with reference to FIG. 1, the first door 102 may include the first group 130 of the plurality of obstructions 108 arranged along the first dimension 116 (e.g., a width) of the first door 102 to form the first plurality of flow channels 118. Thus, the flow of the airflow may be diverted by the first group 130 of the plurality of obstructions 108 and received by the first plurality of flow channels 118 of the first door 102.

The method may further include, at 604, routing at least a portion of the airflow from the first plurality of flow channels to a second plurality of flow channels. For example, as described with reference to FIG. 1, the first door 102 may include the second group 132 of the plurality of obstructions 128 arranged along the first dimension 116 (e.g., the width) of the first door 102 and offset from the first group 130 of the plurality of obstructions 108 along the second dimension 114 orthogonal to the first dimension 116 (e.g., a thickness) of the first door 102. The second group 132 of the plurality of obstructions 108 defines the second plurality of flow channels 120. Thus, the flow of the airflow may be diverted by the second group 132 of the plurality of obstructions 128 and received by the second plurality of flow channels 120 of the first door 102.

In addition, the method may include, at 606, routing the portion of the airflow from the second plurality of flow channels into the plenum region of the server rack system. For example, as described with reference to FIG. 1, the first door 102 may include the second plurality of flow channels 120 that are configured to receive the airflow from the first plurality of flow channels 118 and to distribute the airflow into the plenum region 112 of the server rack system 100.

The method 600 may also include, at 608, receiving the portion of the airflow from the plenum region of the server rack system and routing the received portion of the airflow to the plurality of fans. For example, as described with reference to FIG. 1, the information technology devices 100 include a plurality of fans. The plurality of fans are configured to receive the airflow within the server rack system 100.

The method 600 may further include, at 610, routing the portion of the airflow from the plurality of fans over the plurality of servers within the server rack system. For example, as described with reference to FIG. 1, the information technology devices 100 include a plurality of fans and a plurality of servers. The plurality of fans are configured to distribute the airflow over the plurality of servers within the server rack system 100.

The method 600 may further include, at 612, receiving the portion of the airflow from the plenum region of the server rack system. For example, as described with reference to FIG. 1, the second door 152 may include the third group 162 of the plurality of obstructions 154 arranged along the third dimension 166 (e.g., a width) of the second door 152 to form the third plurality of flow channels 158. Thus, the flow of the airflow received from the plenum region 112 may be diverted by the third group 162 of the plurality of obstructions 154 and received by the third plurality of flow channels 158 of the second door 152.

The method 600 may further include, at 614, routing the portion of the airflow from the third plurality of flow channels to the fourth plurality of flow channels. For example, as described with reference to FIG. 1, the second door 152 may include the fourth group 164 of the plurality of obstructions 156 arranged along the third dimension 166 (e.g., the width) of the second door 152 and offset from the third group 162 of the plurality of obstructions 154 along the fourth dimension 170 orthogonal to the third dimension 116 (e.g., a thickness) of the second door 152. The fourth group 164 of the plurality of obstructions 156 defines the fourth plurality of flow channels 160. Thus, the flow of the airflow may be diverted by the fourth group 164 of the plurality of obstructions 154 and received by the fourth plurality of flow channels 160 of the second door 152.

Accordingly, various embodiments of the disclosure provide a server rack door that divides airflow into a large number of parallel paths that are distributed across the width of the server rack door. The airflow in each path may be redirected over a relatively small distance, such as less than 2 inches, creating a relatively uniform flow field entering the server rack, while not creating hot spots in the server rack system. Additionally, since the plurality of obstructions are arranged in offset or staggered groups, no direct line-of-sight path exists for noise to exit the server rack door. Each of the plurality of obstructions may have a streamlined shape, which permits the airflow to turn smoothly as the airflow passes through the doors.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to explain the principles of the embodiments, the practical application or technical improvement over technologies found in the marketplace, or to enable others of ordinary skill in the art to understand the embodiments disclosed herein.

Those skilled in the art can make numerous uses and modifications of and departures from the apparatus and techniques disclosed herein without departing from the described concepts. For example, components or features illustrated or described in the present disclosure are not limited to the illustrated or described locations, settings, or contexts. Examples of apparatuses in accordance with the present disclosure can include all, fewer, or different components than those described with reference to one or more of the preceding figures. The present disclosure is therefore not to be limited to specific implementations described herein, but rather is to be accorded the broadest scope possible consistent with the appended claims, and equivalents thereof.

What is claimed is:

1. An apparatus, comprising:
a server rack door having a first dimension and a second dimension orthogonal to the first dimension, the server rack door including:
a first group of first obstructions arranged along the first dimension, the first obstructions defining a first plurality of flow channels, wherein an obstruction of the first group of obstructions includes a first acoustic reflective structure that at least partially encapsulates a first acoustic absorbing material, wherein the first acoustic reflective structure includes a first polygonal shape;
a second group of second obstructions arranged along the first dimension and offset from the first obstructions along the second dimension, wherein the second dimension corresponds to a thickness of the server rack door, wherein the second obstructions define a second plurality of flow channels, wherein the first obstructions and the second obstructions alternate along the first dimension, wherein the second group of obstructions includes a second acoustic reflective structure that at least partially encapsulates a second acoustic absorbing material, and wherein the second reflective structure includes a second polygonal shape that is different than the first polygonal shape; and
a plenum region to receive an airflow from the second plurality of flow channels.

2. The apparatus of claim 1, further comprising a plurality of support members defining a plurality of server bays.

3. The apparatus of claim 2, further comprising a plurality of fans coupled to at least one of the plurality of support members, wherein the plurality of fans provide the airflow to the plurality of server bays and at least one of the server rack doors.

4. The apparatus of claim 1, wherein the acoustic first reflective structure is configured to support the first acoustic absorbing material.

5. The apparatus of claim 1, further comprising a second server rack door having a third dimension and a fourth dimension orthogonal to the third dimension.

6. The apparatus of claim 5, wherein the second server rack door comprises a third group including third obstructions arranged along the third dimension, the third obstructions defining a third plurality of flow channels.

7. The apparatus of claim 6, wherein the second server rack door further comprises a fourth group including fourth obstructions arranged along the third dimension and offset from the third obstructions along the fourth dimension, wherein the fourth dimension corresponds to a thickness of the server rack door, wherein the fourth obstructions define a fourth plurality of flow channels, and wherein the third obstructions and the fourth obstructions alternate along the third dimension.

8. The apparatus of claim 6, wherein the first acoustic reflective structure includes a surface that is hexagonal.

9. The apparatus of claim 1, wherein each obstruction of the first group of obstructions comprise a first side and a second side, wherein the first side includes a structural member.

10. The apparatus of claim 1, further comprising an adjustment device coupled to the first group of the first obstructions and the second group of the second obstructions.

11. An apparatus including:
a server rack door having a first dimension and a second dimension, the server rack door comprising:
a first group of first obstructions arranged along the first dimension, the first obstructions defining a first plurality of flow channels, wherein an obstruction of the first group of obstructions includes a first acoustic reflective structure that at least partially encapsulates a first acoustic absorbing material, wherein the first acoustic reflective structure includes a first polygonal shape; and
a second group of second obstructions arranged along the first dimension and offset from the first obstructions along the second dimension orthogonal to the first dimension, wherein the second dimension corresponds to a thickness, wherein the second obstructions define a second plurality of flow channels, wherein the first obstructions and the second obstructions alternate along the first dimension, wherein the second obstructions include a second acoustic reflective structure that at least partially encapsulates a second acoustic absorbing material, and wherein the second reflective structure includes a second polygonal shape that is different than the first polygonal shape; and
a plenum region to receive an airflow from the second plurality of flow channels.

12. The apparatus of claim 11, wherein each obstruction of the second obstructions comprise a first side and a second side, wherein the first side includes a structural member.

13. The apparatus of claim 12, wherein the second side includes the first acoustic absorbing structure.

14. The apparatus of claim 13, wherein the structural member is configured to support the first acoustic absorbing structure.

15. The apparatus of claim 11, wherein each obstruction of the first obstructions has a polygon shaped cross-section along a plane parallel to the first dimension.

16. The apparatus of claim 11, further comprising an adjustment device coupled to the first obstructions and the second group of the second obstructions.

17. The apparatus of claim 11, further comprising a third group including third obstructions arranged along the first dimension and offset from the second obstructions along the second dimension, the third obstructions defining a third plurality of flow channels.

18. The apparatus of claim 11, wherein the acoustic first reflective structure is configured to support the first acoustic absorbing material.

19. The apparatus of claim 11, further comprising a second server rack door having a third dimension and a fourth dimension orthogonal to the third dimension.

20. The apparatus of claim 19, wherein the second server rack door comprises a third group including third obstructions arranged along the third dimension, the third obstructions defining a third plurality of flow channels.

* * * * *